United States Patent
Bakker et al.

(10) Patent No.: US 7,737,425 B2
(45) Date of Patent: *Jun. 15, 2010

(54) CONTAMINATION BARRIER WITH EXPANDABLE LAMELLAS

(75) Inventors: Levinus Pieter Bakker, Helmond (NL); Marcel Mathijs Theodore Marie Dierichs, Venlo (NL); Johannes Maria Freriks, Veldhoven (NL); Frank Jeroen Pieter Schuurmans, Valkenswaard (NL); Jakob Vijfvinkel, Eindhoven (NL); Wilhelmus Josephus Box, Eksel (BE)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 11/798,710

(22) Filed: May 16, 2007

(65) Prior Publication Data

US 2007/0222956 A1 Sep. 27, 2007

Related U.S. Application Data

(63) Continuation of application No. 10/743,265, filed on Dec. 23, 2003, now Pat. No. 7,247,866.

(30) Foreign Application Priority Data

Dec. 23, 2002 (EP) .................................. 02080454
Jan. 13, 2003 (EP) .................................. 03075086

(51) Int. Cl.
*G21F 1/12* (2006.01)

(52) U.S. Cl. .................... 250/515.1; 250/492.1; 355/30
(58) Field of Classification Search ............. 250/492.1, 250/515.1
See application file for complete search history.

(56) References Cited

U.S. PATENT DOCUMENTS

| 4,267,707 | A | * | 5/1981 | Hemmerich | 62/55.5 |
| 5,229,872 | A | | 7/1993 | Mumola | 359/40 |
| 5,296,891 | A | | 3/1994 | Vogt et al. | 355/67 |
| 5,523,193 | A | | 6/1996 | Nelson | 430/311 |
| 5,969,441 | A | | 10/1999 | Loopstra et al. | 310/12 |
| 6,046,792 | A | | 4/2000 | Van Der Werf et al. | 355/53 |
| 6,359,969 | B1 | | 3/2002 | Shmaenok | 378/156 |

(Continued)

FOREIGN PATENT DOCUMENTS

EP 1 057 079 4/2004

(Continued)

*Primary Examiner*—David A. Vanore
*Assistant Examiner*—Phillip A. Johnston
(74) *Attorney, Agent, or Firm*—Pillsbury Winthrop Shaw Pittman, LLP

(57) ABSTRACT

A contamination barrier configured to permit radiation from a radiation source to pass through and to capture debris from the radiation source. The contamination barrier includes a support structure, a plurality of plate members arranged on the support structure and extending in a radial direction from an axis of the support structure, and a shield configured to block at least part of the support structure from being hit by radiation or debris from the radiation source.

21 Claims, 5 Drawing Sheets

U.S. PATENT DOCUMENTS

| | | |
|---|---|---|
| 6,452,199 B1 * | 9/2002 | Partlo et al. .............. 250/504 R |
| 6,459,472 B1 | 10/2002 | De Jager et al. ................ 355/68 |
| 6,838,684 B2 | 1/2005 | Bakker et al. ............ 250/492.2 |
| 6,867,843 B2 * | 3/2005 | Ogushi et al. .................. 355/30 |
| 7,057,190 B2 | 6/2006 | Bakker et al. ............ 250/492.2 |
| 7,274,435 B2 * | 9/2007 | Hiura et al. .................... 355/67 |
| 2006/0012761 A1 | 1/2006 | Bakker et al. .................. 355/30 |
| 2006/0138348 A1 | 6/2006 | Bakker .................... 250/492.1 |
| 2006/0138362 A1 | 6/2006 | Bakker et al. ................ 250/504 |
| 2006/0151717 A1 | 7/2006 | Klunder et al. .......... 250/492.2 |
| 2006/0219958 A1 | 10/2006 | Wassink ..................... 250/504 |
| 2006/0261290 A1 | 11/2006 | Van Herpen et al. ..... 250/492.2 |
| 2007/0018118 A1 | 1/2007 | Sjmaenok et al. ........ 250/492.2 |
| 2007/0023693 A1 | 2/2007 | Bakker et al. ............ 250/492.2 |
| 2007/0023706 A1 | 2/2007 | Sjmaenok et al. ........... 250/504 |

FOREIGN PATENT DOCUMENTS

| | | |
|---|---|---|
| JP | 2000-346999 | 12/2000 |
| JP | 2001-57298 | 2/2001 |
| JP | 2002-214400 | 7/2002 |
| JP | 2002-313598 | 10/2002 |
| JP | 2003-22950 | 1/2003 |
| JP | 2004-6716 | 1/2004 |
| WO | WO98/33096 | 7/1998 |
| WO | WO98/38597 | 9/1998 |
| WO | WO98/40791 | 9/1998 |
| WO | WO 99/42904 | 8/1999 |
| WO | WO02/054153 | 7/2002 |

* cited by examiner

CONTAMINATION BARRIER WITH EXPANDABLE LAMELLAS

CROSS-REFERENCE TO RELATED APPLICATIONS

This application is a continuation of U.S. patent application Ser. No. 10/743,265, filed on Dec. 23, 2003 now U.S. Pat. No. 7,247,866, which is based on and claims the benefit of priority from European Patent Application No. 02080454.8, filed Dec. 23, 2002, and European Patent Application No. 03075086.3, filed Jan. 13, 2003, the contents of each being hereby incorporated by reference in their entireties.

BACKGROUND OF THE INVENTION

1. Field of the Invention

The invention relates generally to a lithographic apparatus, and more specifically to a contamination barrier for passing through radiation from a radiation source and for capturing debris coming from the radiation source.

2. Description of Related Art

A contamination barrier for a lithographic apparatus is known from, for example, the international patent application WO 02/054153. The contamination barrier is normally positioned in a wall between two vacuum chambers of a radiation system of a lithographic projection apparatus.

In a lithographic projection apparatus, the size of features that can be imaged onto a substrate is limited by the wavelength of projection radiation. To produce integrated circuits with a higher density of devices, and hence higher operating speeds, it is desirable to be able to image smaller features. While most current lithographic projection apparatus employ ultraviolet light generated by mercury lamps or excimer lasers, it has been proposed to use shorter wavelength radiation in the range 5 to 20 nm, especially around 13 nm. Such radiation is termed extreme ultraviolet (EUV), or soft x-ray, and possible sources include, for example, laser-produced plasma sources, discharge plasma sources, or synchrotron radiation from electron storage rings. Apparatus using discharge plasma sources are described in: W. Partlo, I. Fomenkov, R. Oliver, D. Birx, "Development of an EUV (13.5 nm) Light Source Employing a Dense Plasma Focus in Lithium Vapor", Proc. SPIE 3997, pp. 136-156 (2000); M. W. McGeoch, "Power Scaling of a Z-pinch Extreme Ultraviolet Source", Proc. SPIE 3997, pp. 861-866 (2000); W. T. Silfvast, M. Klosner, G. Shimkaveg, H. Bender, G. Kubiak, N. Formaciari, "High-Power Plasma Discharge Source at 13.5 and 11.4 nm for EUV lithography", Proc. SPIE 3676, pp. 272-275 (1999); and K. Bergmann et al., "Highly Repetitive, Extreme Ultraviolet Radiation Source Based on a Gas-Discharge Plasma", Applied Optics, Vol. 38, pp. 5413-5417 (1999).

EUV radiation sources may require the use of a rather high partial pressure of a gas or vapor to emit EUV radiation, such as discharge plasma radiation sources referred to above. In a discharge plasma source, for example, a discharge is created between electrodes, and a resulting partially ionized plasma may subsequently be caused to collapse to yield a very hot plasma that emits radiation in the EUV range. The very hot plasma is quite often created in Xe, since a Xe plasma radiates in the Extreme UV (EUV) range around 13.5 nm. For an efficient EUV production, a typical pressure of 0.1 mbar is required near the electrodes to the radiation source. A drawback of having such a rather high Xe pressure is that Xe gas absorbs EUV radiation. For example, 0.1 mbar Xe transmits over 1 m only 0.3% EUV radiation having a wavelength of 13.5 nm. It is therefore required to confine the rather high Xe pressure to a limited region around the source. To reach this, the source can be contained in its own vacuum chamber that is separated by a chamber wall from a subsequent vacuum chamber in which the collector mirror and illumination optics may be obtained. The chamber wall can be made transparent to EUV radiation by a number of apertures in the wall provided by a contamination barrier or so-called "foil trap," such as the one described in European Patent application number EP-A-1 057 079, which is incorporated herein by reference. In EP-A-1 057 079 a foil trap has been proposed to reduce the number of particles propagating along with the EUV radiation. This foil trap consists of a number of lamella shaped walls, which are close together in order to form a flow resistance, but not too close so as to let the radiation pass without substantially obstructing it. The lamellas can be made of very thin metal platelets, and are positioned near the radiation source. The lamellas are positioned in such a way, that diverging EUV radiation coming from a radiation source, can easily pass through, but debris coming from the radiation source is captured. Debris particles collide with gas inside the foil trap, are scattered thereby, and eventually collide with the lamellas and stick to these lamellas.

The lamellas, however, absorb some EUV radiation and heat. Moreover, they are heated by colliding debris particles. This results in significant heating of the lamellas and a supporting structure which supports the lamellas. Since optical transmission is very important in a lithographic projection apparatus, mechanical deformation is not allowed.

SUMMARY OF THE INVENTION

Therefore, it is an aspect of the present invention to provide a contamination barrier in which disadvantageous deformation of lamellas is minimized.

It is another aspect of embodiments of the present invention to provide a foil trap for a lithographic projection apparatus. The foil trap forms an open structure to let radiation coming from, for example, an EUV source, pass unhindered. The foil trap comprises lamellas arranged to capture debris particles coming from the radiation source. The lamellas are extending in a radial direction from a foil trap axis. In order to prevent mechanical stress, the lamellas are slidably connected in grooves of one or both of the rings. In this way, the lamellas can expand easily and mechanical stress is avoided, so that there is no deformation of the lamellas. At least one of the outer ends of the lamellas is thermally connected to a ring. This ring may be cooled by a cooling system. In a preferred embodiment, the foil trap comprises a shield to protect the inner ring from being hit by the EUV beam.

This aspect is achieved according to embodiments of the present invention by a contamination barrier. The contamination barrier comprises a number of lamellas extending in a radial direction from a main axis, each of the lamellas being positioned in a plane that contains the main axis, characterized in that the contamination barrier comprises an inner ring and an outer ring and that each of the lamellas is slidably positioned at least one of its outer ends in grooves of at least one of the inner and outer ring.

Embodiments also provide for a contamination barrier that passes through radiation from a radiation source and captures debris coming from the radiation source. The contamination barrier includes an inner ring, an outer ring, and a plurality of lamellas that extend in a radial direction from a main axis. Each of the lamellas is positioned in a respective plane that includes the main axis. At least one outer end of each of the lamellas is slidably connected to at least one of the inner and outer ring.

Embodiment of the invention further provide for a contamination barrier that passes through radiation from a radiation source and captures debris coming from the radiation source. The contamination barrier includes a plurality of lamellas, and a support structure that slidably engages the lamellas. The lamellas and the support structure are configured and arranged to allow the lamellas to expand and contract in response to changes in temperature.

Embodiment of the invention also provide for a contamination barrier that permits radiation to pass therethrough and captures debris from a radiation source generated by the radiation source. The contamination barrier includes a support structure and a plurality of thin plate members mounted on the support structure. The radiation propagates along an optical axis and the thin plate members are disposed along a plane that includes the axis. The plate members are slidably movable relative to the support structure.

By slidably positioning one of the outer ends of a lamella, the lamella can expand in a radial direction without the appearance of mechanical tension which may create a deformation of the lamella.

Preferably, the lamellas are thermally connected to at least one of the inner and outer ring. In this way, heat from the lamellas will be transported to the rings. Note that a thermal connection is not necessarily a mechanical connection; heat conduction from the lamellas to the rings is even possible when the connection is slidable. Furthermore, a connection using a heat conducting gel between the lamellas and the rings is possible.

In an embodiment, the contamination barrier comprises a first shield arranged to protect the inner ring from being hit by radiation from the radiation source. In this way, the heating of the inner ring is limited. Preferably, the contamination barrier comprises a second shield arranged to block thermal radiation from the first shield. By blocking the heat radiation coming from the first heat shield, the beam going into the collector is not exposed by unwanted radiation.

In a further embodiment, upstream of the first shield, with respect to the direction of propagation of the radiation emitted by the radiation source along the main axis, a third shield is provided, constructed and arranged to reduce heating of the first shield caused by direct radiation from the radiation source. The third shield prevents the first shield from being excessively heated by direct radiation from the radiation source, and consequently further reduces heat radiating from the first shield towards the collector.

In an embodiment, there is provided a contamination barrier configured to permit radiation from a radiation source to pass through and to capture debris from the radiation source. The contamination barrier includes a support structure, a plurality of plate members arranged on the support structure and extending in a radial direction from an axis of the support structure, and a shield configured to block at least part of the support structure from being hit by radiation or debris from the radiation source.

In another embodiment, there is provided a lithographic projection apparatus that includes a radiation system configured to form a beam of radiation. The radiation system includes a contamination barrier configured to permit radiation from a radiation source to pass through and to capture debris from the radiation source. The contamination barrier includes a support structure, a plurality of plate members arranged on the support structure and extending in a radial direction from an axis of the support structure, and a shield configured to block at least part of the support structure from being hit by radiation or debris from the radiation source. The lithographic apparatus also includes a support structure to support a patterning structure to be irradiated by a beam of radiation to pattern the beam of radiation, a substrate support to support a substrate, and a projection system to image an irradiated portion of the patterning structure onto a target portion of the substrate.

In a further embodiment, there is provided a method of manufacturing an integrated structure by a lithographic process. The method includes generating radiation with a radiation source, capturing debris from the radiation source using a contamination barrier that includes a support structure, a plurality of plate members arranged on the support structure and extending in a radial direction from an axis of the support structure, and a shield configured to block at least part of the support structure from being hit by radiation or debris from the radiation source. The method also includes patterning the radiation with a patterning structure, and imaging the patterned radiation onto a target portion of a substrate.

In an embodiment, the contamination barrier also comprises at least one cooling spoke to support the first shield, wherein the cooling spoke is thermally connected to the outer ring. The cooling spoke can be made of metal or any other heat conductive material, such as carbon. The cooling spoke not only supports the first shield, but also transports heat from the first heat shield to the outer ring.

In an embodiment, the first shield comprises a number of shield members, each shield member being connected to the outer ring via a separate cooling spoke.

In a further embodiment, the contamination barrier comprises a first cooling device or structure that is arranged to cool at least one of the first and second shield. In this case, a cooling spoke as described above is not necessary. The cooling device may comprise a cooling system in which a cooling fluid is used to remove the heat away from the contamination barrier. The cooling device may be part of a cooling system used in a collector. In this way, the cooling device will be in the shadow of the heat shields, and thus not blocking the EUV radiation beam. Preferably, the heat shields are supported by the cooling device. Vibrations coming from the cooling system will not reach the lamellas of the contamination barrier because the inner ring is not fixed to the cooling system.

In yet another embodiment, the contamination barrier comprises a second cooling device arranged to cool the inner ring. If the cooling ring is cooled directly, there will be no need for a heat shield.

In a further embodiment, the contamination barrier comprises a third cooling device arranged to cool the outer ring. If the lamellas are slidably connected to the inner ring and thermally connected to the outer ring, the heat form the lamellas will go to the outer ring. The outer ring can be easily cooled by for example water cooling, since it is outside the EUV optical path.

Preferably, the lamellas are curved in the respective planes, and the inner and outer ring are shaped as slices of a conical pipe. If the surfaces of the outer and inner ring are focused on the EUV source, the EUV beam will be blocked by the rings as little as possible. Only the inner ring will be in the way for the EUV beam, which is unavoidable. However, no light is lost, as the collector is unable to collect radiation in this solid angle anyway.

In a further embodiment, a first side of the lamellas, at least in use facing the radiation source, is thicker than the rest of the lamellas. In this way, the influence of minor warping of the lamellas is reduced. The warped lamellas should be positioned in the shadow of the thick front side of the lamellas. This measure results in better uniformity of the transmission of the contamination barrier.

The present invention also relates to a radiation system comprising a contamination barrier as described above, and a collector for collecting radiation passing the contamination barrier.

It is another aspect of the present invention to extend the lifetime of a collector of a radiation system. Therefore, embodiments of the invention relate to a radiation system comprising: a contamination barrier for passing through radiation from a radiation source and for capturing debris coming from the radiation source, the contamination barrier comprising a number of lamellas, and a collector for collecting radiation passing the contamination barrier, characterized in that a surface of the lamellas is covered with the same material as an optical surface of the collector.

In an embodiment, there is provided a radiation system that includes a contamination barrier configured to permit radiation from a radiation source to pass through and to capture debris coming from the radiation source, the contamination barrier comprising a plurality of lamellas, the surface of the lamellas comprising a material, and a collector configured to collect radiation from the contamination barrier, an optical surface of the collector comprising a material that is the same as the material of the surface of the lamellas.

In an embodiment, there is provided a lithographic projection apparatus that includes a radiation system to form a beam of radiation. The radiation system includes a contamination barrier configured to permit radiation from a radiation source to pass through and to capture debris coming from the radiation source, the contamination barrier comprising a plurality of lamellas, the surface of the lamellas comprising a material, and a collector configured to collect radiation from the contamination barrier, an optical surface of the collector comprising a material that is the same as the material of the surface of the lamellas. The lithographic apparatus also includes a support structure to support a patterning structure to be irradiated by a beam of radiation to pattern the beam of radiation, a substrate support to support a substrate, and a projection system to image an irradiated portion of the patterning structure onto a target portion of the substrate.

In a further embodiment, there is provided a method of manufacturing a device by a lithographic process. The method includes passing radiation from a radiation source through a contamination barrier comprising a plurality of lamellas, the surface of the lamellas comprising a material and the contamination barrier capturing debris from the radiation source, collecting radiation from the contamination barrier with a collector, an optical surface of the collector comprising a material that is the same as the material of the surface of the lamellas, patterning radiation from the collector, and projecting the patterned radiation onto a target portion of a substrate.

Embodiments also provide a radiation system that includes a contamination barrier that passes through radiation from a radiation source and captures debris coming from the radiation source, and a collector that collects radiation passing the contamination barrier. The contamination barrier includes an inner ring, an outer ring, and a plurality of lamellas that extend in a radial direction from a main axis. Each of the lamellas is positioned in a respective plane that includes the main axis, and at least one outer end of each of the lamellas is slidably connected to at least one of the inner and outer ring.

Another embodiment includes a radiation system that includes a contamination barrier that passes through radiation from a radiation source and captures debris coming from the radiation source, and a collector that collects radiation passing the contamination barrier. The contamination barrier includes a plurality of lamellas, and a surface of the lamellas is covered with the same material as an optical surface of the collector.

When material is sputtered off of the contamination barrier onto the collector, the life time of the collector is only minimally influenced if the materials are equal.

Embodiments of the invention also relate to a lithographic projection apparatus comprising: a support structure constructed and arranged to hold a patterning device, to be irradiated by a projection beam of radiation to pattern the projection beam of radiation, a substrate table constructed and arranged to hold a substrate, and a projection system constructed and arranged to image an irradiated portion of the patterning device onto a target portion of the substrate, wherein the projection apparatus comprises a radiation system for providing a projection beam of radiation as described above.

A further embodiment is directed to a lithographic projection apparatus. The lithographic projection apparatus includes a radiation system to provide a beam of radiation, a support structure to support a patterning structure to be irradiated by a beam of radiation to pattern said beam of radiation, a substrate support to support a substrate, and a projection system to image an irradiated portion of the patterning structure onto a target portion of the substrate. The radiation system includes a contamination barrier that passes through radiation from a radiation source and captures debris coming from the radiation source and a collector for collecting radiation passing the contamination barrier. The contamination barrier includes an inner ring, an outer ring, and a plurality of lamellas that extend in a radial direction from a main axis. Each of the lamellas is positioned in a respective plane that includes the main axis, and each of the lamellas is slidably connected to at least one of the inner and outer ring.

Yet another embodiment is directed to a lithographic projection apparatus that includes a radiation system to provide a beam of radiation, a support structure to support a patterning structure to be irradiated by a beam of radiation to pattern the beam of radiation, a substrate support to support a substrate; and a projection system to image an irradiated portion of the patterning structure onto a target portion of the substrate. The radiation system includes a contamination barrier that passes through radiation from a radiation source and captures debris coming from the radiation source, and a collector that collects radiation passing the contamination barrier. The contamination barrier includes a plurality of lamellas, wherein a surface of the lamellas is covered with the same material as an optical surface of the collector.

Another embodiment is directed to a method of manufacturing an integrated structure by a lithographic process. The method includes radiating a beam of radiation through a radiation system, providing a support structure to support a patterning structure to be irradiated by the beam of radiation to pattern said beam of radiation, providing a substrate support to support a substrate, and providing a projection system to image an irradiated portion of the patterning structure onto a target portion of the substrate. Radiating the beam of radiation through the radiation system includes passing radiation from a radiation source through a contamination barrier comprising an inner ring, an outer ring, and a plurality of lamellas extending in a radial direction from a main axis. Each of the lamellas are positioned in a respective plane that comprises the main axis, and at least one outer end of each of the lamellas is slidably connected to at least one of the inner and outer ring. Radiating the beam of radiation also includes collecting radiation passing the contamination barrier.

Embodiments of the invention also relate to a method of manufacturing an integrated structure by a lithographic process. The method includes radiating a beam of radiation through a radiation system, providing a support structure to support a patterning structure to be irradiated by the beam of radiation to pattern said beam of radiation, providing a substrate support to support a substrate, and providing a projection system to image an irradiated portion of the patterning structure onto a target portion of the substrate. Radiating the beam of radiation through the radiation system includes passing radiation from a radiation source through a contamination barrier that includes a plurality of lamellas, capturing debris from the radiation source, and collecting radiation passing the contamination barrier. A surface of the lamellas is covered with the same material as an optical surface of the collector.

Embodiments of the invention are also directed to a method of manufacturing an integrated structure by a lithographic process. The method includes generating a beam of radiation with a radiation source, capturing debris from the radiation source, collecting radiation passing the contamination barrier patterning the beam of radiation with a patterning structure, and imaging an irradiated portion of the patterning structure onto a target portion of a substrate. Capturing debris comprises providing a support structure and a plurality of lamellas that are slidably engaged with the support structure so as to allow the plurality of lamellas to expand and contract in response to changes in temperature.

The term "patterning device" as here employed should be broadly interpreted as referring to a device that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such patterning devices include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing a piezoelectric actuation device. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning device can comprise one or more programmable mirror arrays. More information on mirror arrays as here referred to can be gleaned, for example, from U.S. Pat. No. 5,296,891 and U.S. Pat. No. 5,523,193, and PCT patent applications WO 98/38597 and WO 98/33096, which are incorporated herein by reference. In the case of a programmable mirror array, the support structure may be embodied as a frame or table, for example, which may be fixed or movable as required; and A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper or step and repeat apparatus. In an alternative apparatus—commonly referred to as a step and scan apparatus—each target portion is irradiated by progressively scanning the mask pattern under the projection beam in a given reference direction (the "scanning" direction) while synchronously scanning the substrate table parallel or anti parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation sensitive material (resist). Prior to this imaging step, the substrate may undergo various procedures, such as priming, resist coating and a soft bake. After exposure, the substrate may be subjected to other procedures, such as a post exposure bake (PEB), development, a hard bake and measurement/inspection of the imaged features. This array of procedures is used as a basis to pattern an individual layer of a device, e.g. an IC. Such a patterned layer may then undergo various processes such as etching, ion implantation (doping), metallization, oxidation, chemo mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0 07 067250 4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both incorporated herein by reference.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid crystal display panels, thin film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5-20 nm), as well as particle beams, such as ion beams or electron beams.

BRIEF DESCRIPTION OF THE DRAWINGS

Embodiments of the invention will now be described, by way of example only, with reference to the accompanying drawings in which.

DETAILED DESCRIPTION OF EMBODIMENTS OF THE INVENTION

Figure 1:
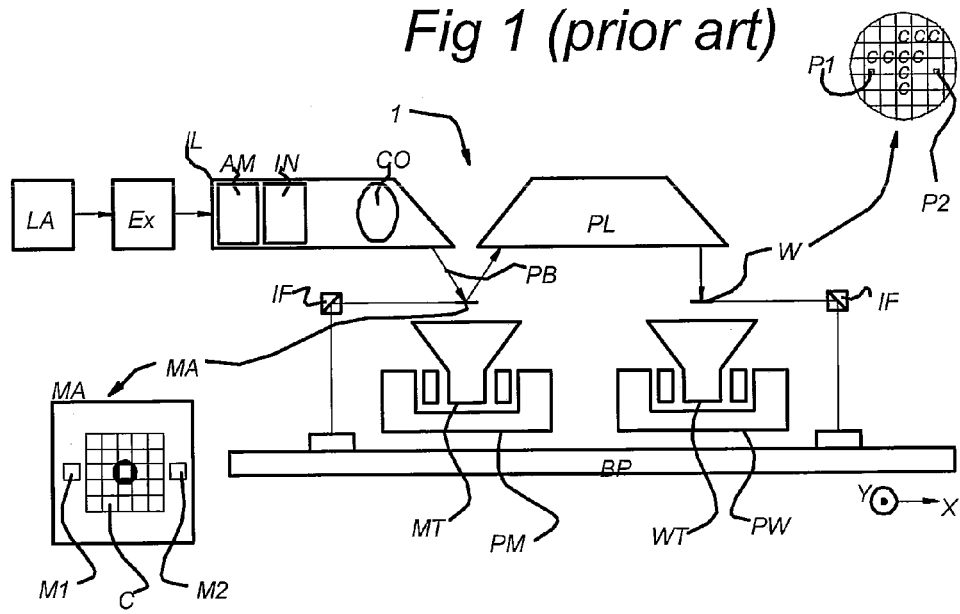
FIG. 1 schematically depicts a lithographic projection apparatus according to embodiments of the present invention.

FIG. 1 schematically depicts a lithographic projection apparatus 1 according to a particular embodiment of the invention. The apparatus comprises: a radiation system Ex, IL, for supplying a projection beam PB of radiation (e.g. EUV radiation) with a wavelength of 11-14 nm. In this particular case, the radiation system also comprises a radiation source LA; a first object table (mask table) MT provided with a mask holder for holding a mask MA (e.g. a reticle), and connected to a first positioning device PM for accurately positioning the mask with respect to item PL; a second object table (substrate table) WT provided with a substrate holder for holding a substrate W (e.g. a resist coated silicon wafer), and connected to a second positioning device PW for accurately positioning the substrate with respect to item PL; and a projection system ("lens") PL for imaging an irradiated portion of the mask MA onto a target portion C (e.g. comprising one or more dies) of the substrate W. The term "object table" as used herein can also be considered or termed as an object support. It should be understood that the term object support or object table broadly refers to a structure that supports, holds, or carries an object, such as a mask or a substrate.

As here depicted, the apparatus is of a reflective type (i.e. has a reflective mask). However, in general, it may also be of a transmissive type, for example (with a transmissive mask). Alternatively, the apparatus may employ another kind of patterning device, such as a programmable mirror array of a type as referred to above.

The source LA (e.g. a laser-produced plasma or a discharge plasma EUV radiation source) produces a beam of radiation. This beam is fed into an illumination system (illuminator) IL, either directly or after having traversed conditioning means, such as a beam expander Ex, for example. The illuminator IL may comprise an adjusting device AM for setting the outer and/or inner radial extent (commonly referred to as σ-outer and σ-inner, respectively) of the intensity distribution in the beam. In addition, it will generally comprise various other components, such as an integrator IN and a condenser CO, see FIG. 1. In this way, the beam PB impinging on the mask MA has a desired uniformity and intensity distribution in its cross section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors). This latter scenario is often the case when the source LA is an excimer laser. Embodiments of the current invention, and claims, encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device PW (and an interferometric measuring device IF), the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:

1. In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB; and 2. In scan mode, essentially the same scenario applies, except that a given target portion C is not exposed in a single "flash". Instead, the mask table MT is movable in a given direction (the so called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the projection system PL (typically, M=¼ or ⅕). In this manner, a relatively large target portion C can be exposed, without having to compromise on resolution.

Figure 2:
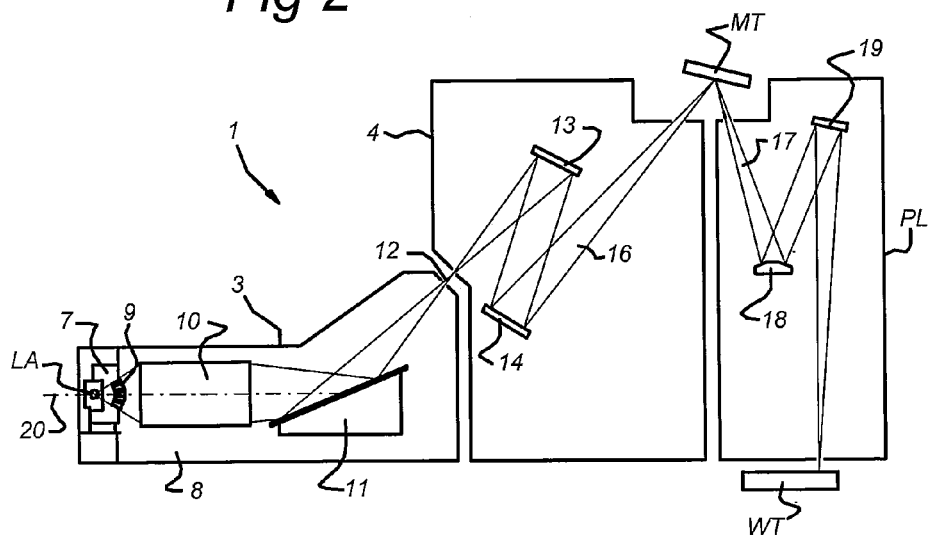
FIG. 2 shows a side view of a part of the apparatus of FIG. 1 in an embodiment, i.e., an EUV illuminating system and projection optics.

FIG. 2 shows an embodiment of the lithographic projection apparatus 1 of FIG. 1, comprising a radiation system 3 (i.e. "source-collector module"), an illumination optics unit 4, and the projection system PL. The radiation system 3 is provided with a radiation source LA which may comprise a discharge plasma source. The radiation source LA may employ a gas or vapor, such as Xe gas or Li vapor in which a very hot plasma can be created to emit radiation in the EUV range of the electromagnetic spectrum. The very hot plasma is created by causing a partially ionized plasma of an electrical discharge to collapse onto an optical axis 20. Partial pressures of 0.1 mbar of Xe gas, Li vapor or any other suitable gas or vapor may be required for efficient generation of the radiation. The radiation emitted by the radiation source LA is passed from a source chamber 7 into a collector chamber 8 via a foil trap 9. The foil trap 9 comprises a channel structure such as, for example, described in detail in European patent application EP-A-1 057 079, which is incorporated herein by reference. The term "foil trap" as used herein can also be considered or termed a contamination barrier. It should be understood that the term foil trap or contamination barrier broadly refers to a structure that captures debris coming from the radiation source LA.

The collector chamber 8 comprises a radiation collector 10 which may be formed by a grazing incidence collector. Radiation passed by the radiation collector 10 is reflected off a grating spectral filter 11 or mirror to be focused in a virtual source point 12 at an aperture in the collector chamber 8. From chamber 8, the projection beam 16 is reflected in the illumination optics unit 4 via normal incidence reflectors 13, 14 onto a reticle or mask positioned on reticle or mask table MT. A patterned beam 17 is formed which is imaged in projection optics system PL via reflective elements 18, 19 onto wafer stage or substrate table WT. More elements than shown may generally be present in illumination optics unit 4 and projection system PL.

Figure 3:
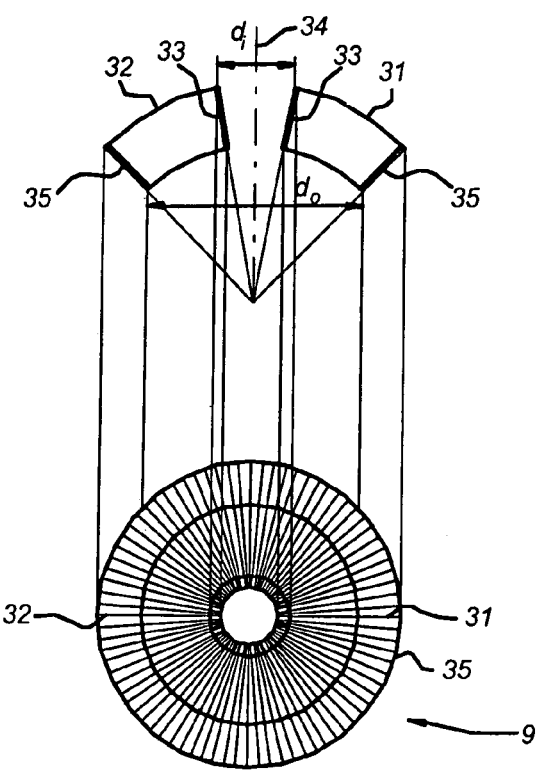
FIG. 3 shows a foil trap with an inner and outer ring, and lamellas according to an embodiment of the invention.

FIG. 3 shows a downstream and a cross-sectional view, respectively, of a foil trap 9 with a plurality of lamellas 31, 32 according to an embodiment of the invention. The foil trap 9 comprises an inner ring 33 and an outer ring 35. Preferably, the inner ring 33 and the outer ring 35 are shaped as slices of a conical pipe, wherein a minimum diameter do of the outer ring 35 is larger than a minimum diameter $d_i$ of the inner ring 33. Preferably, both conical rings 33, 35 share the same main axis 34 and focus. Preferably, the foil trap 9 is arranged in a lithographic projection apparatus, in such a way that the main axis 34 of the foil trap 9 and the optical axis 20 of the radiation system 3 coincide, see FIG. 2.

Figure 4:
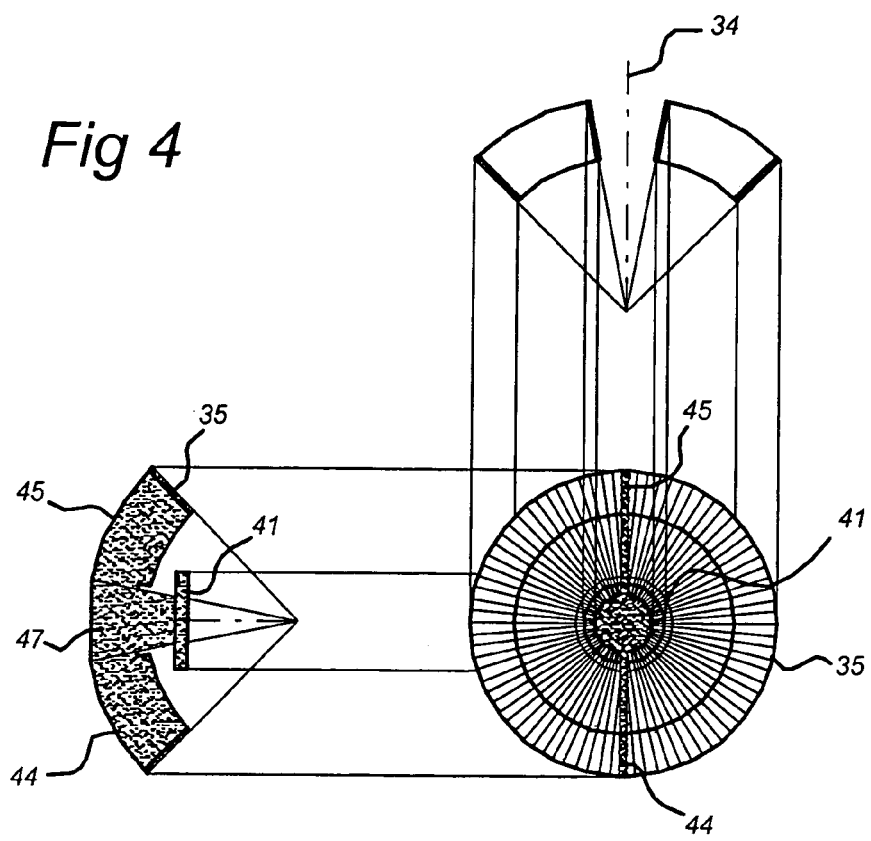
FIG. 4 shows a foil trap with a cooling spoke and a heat shield according to an embodiment of the invention.

In FIG. 4, the foil trap 9, as shown, comprises a heat shield 41. The heat shield 41 is supported by two cooling spokes 44, 45 which are mechanically and thermally connected to the outer ring 35. At the center of the foil trap 9, the cooling spokes 44, 45 connect to a spindle 47, which supports the heat shield 41. The heat shield 41 comprises a disk, which avoids the inner ring 33 from being hit by the emitted radiation and heat from the radiation source LA. In this way, the heat shield 41 shields off the inner ring 33. The cooling spokes 44, 45, the spindle 47 and the heat shield 41 are preferably made of a good heat conductor. In this way, heat developed on the heat shield 41, may easily be transferred to the outer ring 35 via the cooling spokes 44, 45.

Alternatively, the heat shield 41 may comprise two (or more) disc parts, each disc part being connected to one cooling spoke 44, 45. In this case, the spindle 47 will also be divided into two (or more) parts.

Figure 5:
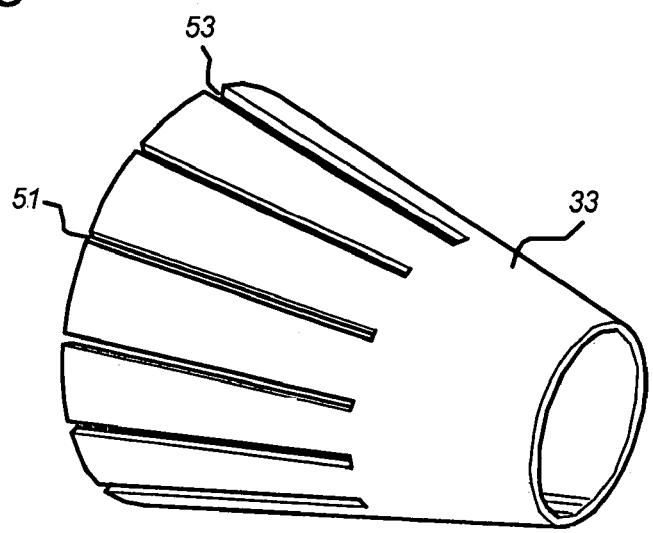
FIG. 5 is a 3-D picture of an inner ring according to an embodiment of the invention.

FIG. 5 shows a perspective view of the inner ring 33 according to an embodiment of the invention. The inner ring 33 comprises a plurality of grooves 51. Preferably, two grooves 53, opposite to one another, have a relative larger width than the other grooves. These larger grooves 53 are provided to pass the cooling spokes 44, 45. According to embodiments of the invention, the inner ring 33 is only supported mechanically by the plurality of lamellas 31, 32 and is not connected to anything other than the lamellas 31, 32.

Figure 6:
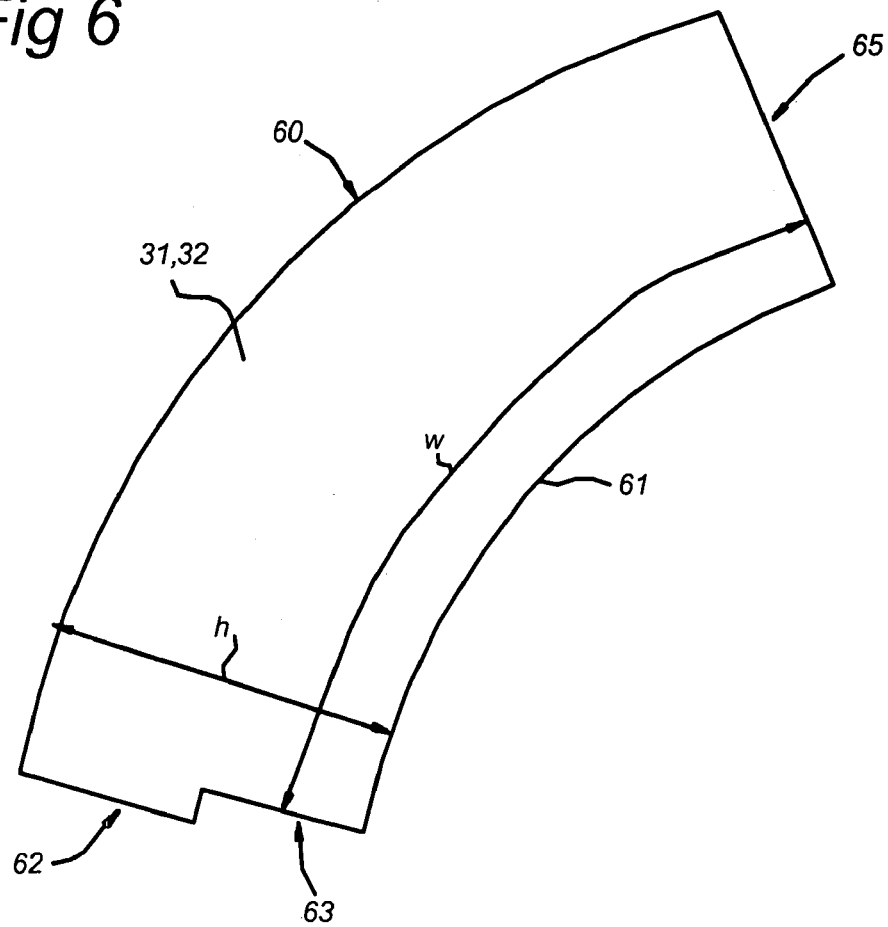
FIG. 6 shows a detailed example of a lamella of a foil trap according to an embodiment of the invention.

FIG. 6 shows a detailed example of the lamella 31, 32 of the foil trap 9 according to an embodiment of the invention. The lamella 31, 32 is a very thin platelet having two curved edges 60, 61, a straight outer edge 65, and an inner edge 62 having an indentation 63. The lamella 31, 32 has a height h and a width w, see FIG. 6. The outer edge 65 is mechanically connected to the outer ring 35, see FIG. 4. The inner edge 62 is inserted into one of the grooves 51 of the inner ring 33, see FIG. 5. Preferably, the lamellas 31, 32 are soldered or welded to the outer ring 35. In this way, a good thermal contact is provided and approximately all the heat absorbed by the lamellas, is transported to the outer ring 35. In one embodiment, the outer ring 35 is cooled by a cooling device, not shown, to remove the heat from the foil trap 9.

Figure 7:
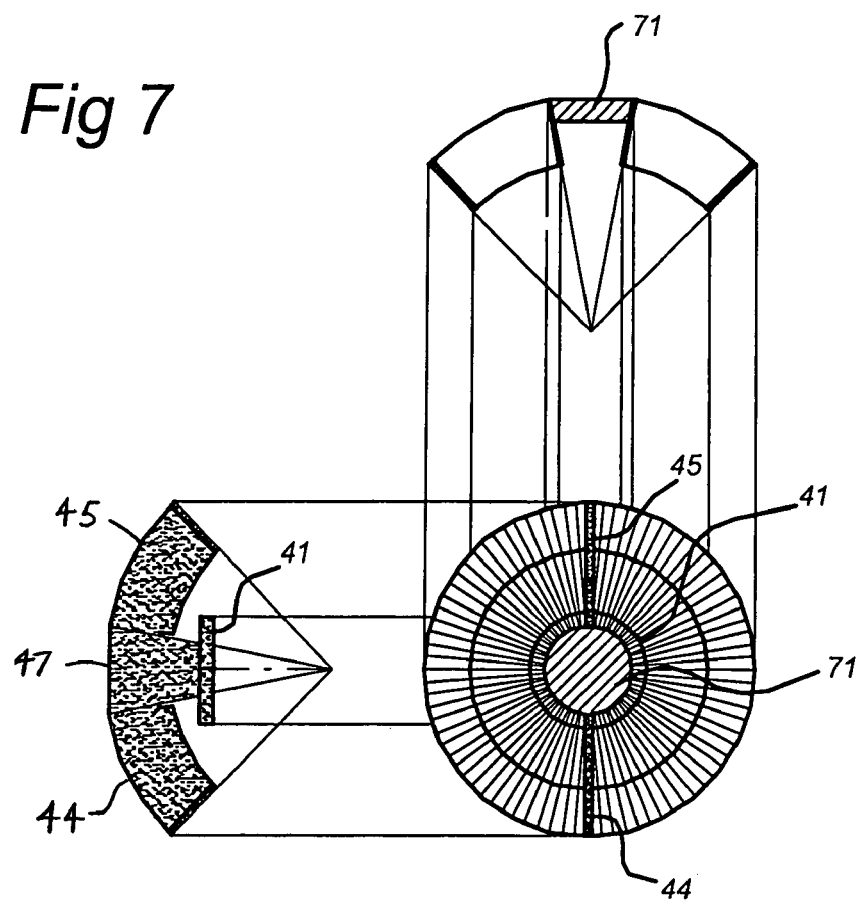
FIG. 7 shows a foil trap with a cooling spoke and two heat shields.

In an embodiment of the invention, the foil trap 9 also comprises a second heat shield in order to block thermal radiation from the first heat shield 41. FIG. 7 shows a foil trap 9 with first and second heat shields 41, 71. In an embodiment, the second heat shield 71 comprises a disc, positioned inside the inner ring 33 and situated at the back end (i.e. down stream side) of this inner ring 33.

In another embodiment, the cooling spoke 44, 45, 47 is absent. In this case, the first and/or second shields 41, 71 are cooled by a cooling device, arranged in a way known by a person skilled in the art. The cooling device may comprise a water cooling system. This water cooling system can be part of a cooling system of the collector 10 of the radiation system 3. In this case, the shields 41, 71 are supported by the cooling device.

In yet another embodiment, the inner ring 33 is cooled by a cooling device. The cooling device for cooling the shields 41; 71 and the cooling device for cooling the inner ring 33, may be one. The foil trap 9 may be focused on the radiation source 6. It is also possible to construct a foil trap 9 without a real focus. In any case, channels, i.e., spaces between adjacent lamellas, in the foil trap 9 have to be aligned with the emitted EUV beam. In FIG. 2, the foil trap 9 is focused on the radiation source such that EUV rays of radiation emitted from the EUV source may pass the lamellas 31, 32 without obstruction. Typical values for the dimensions of the lamellas are: height h=30 mm, thickness 0.1 mm and width w=50 mm (curved). A typical value for the channel width, i.e. the distance between adjacent lamellas, is 1 mm. The distance from the foil trap 9 to the source LA is typically in the order of 60 mm. These specific dimensions are examples and should not be considered to be limiting in any way.

Figure 8:
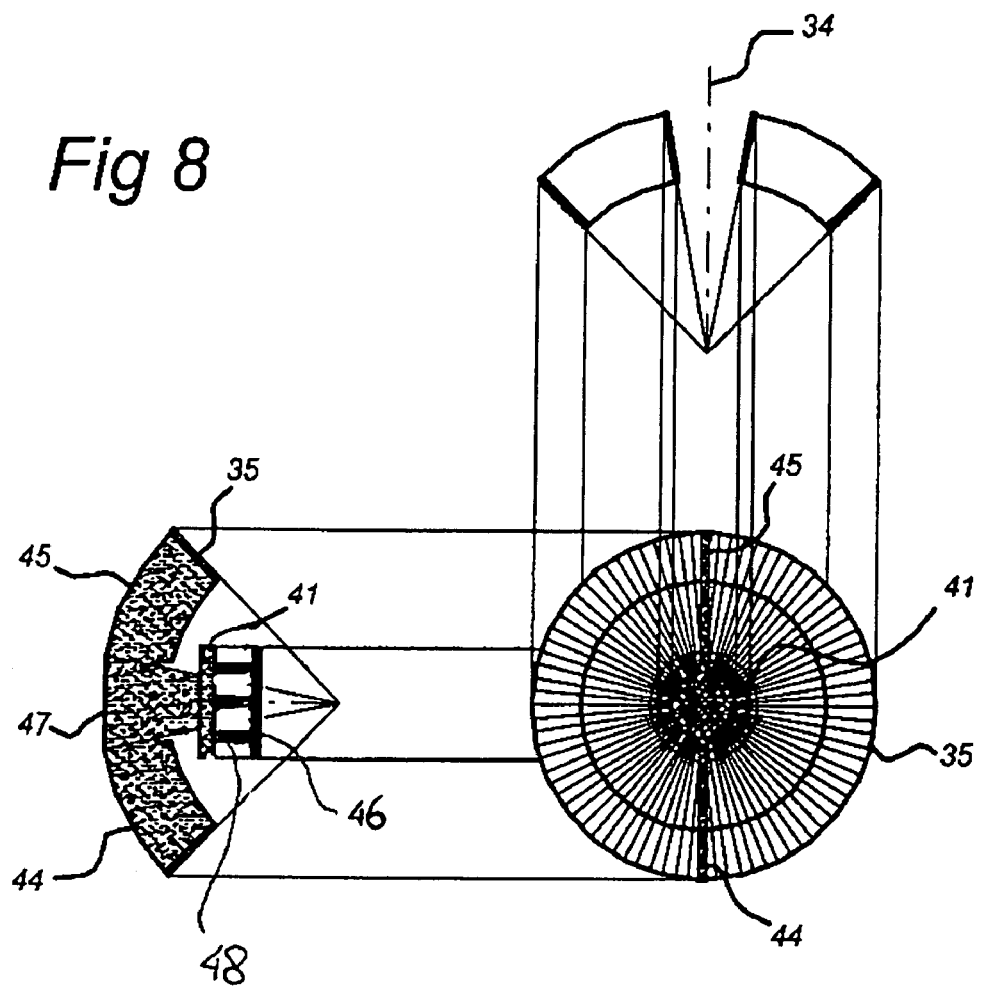
FIG. 8 shows alternative embodiment of a foil trap with a cooling spoke and two heat shields.

The embodiment of FIG. 8 is similar to the one shown in FIG. 4, except for the additional heat shield 46, mounted in front of shield 41. The additional shield 46 prevents the first shield 41 from being excessively heated by direct radiation from the radiation source LA, and consequently reduces heat radiating from the first shield 41 towards the collector 10. The additional heat shield 46 may be mounted on shield 41 using a dedicated separation device 48 in order to accomplish substantially thermal isolation between the two shields. The separation device 48 may be manufactured e.g. from ceramics, which is able to resist the heat caused by the radiation impinging on the additional shield 46 and has a very small heat conduction coefficient. In another embodiment of the separation device 48, it may be envisaged that by special design of the separation device a heat resistance is created between the additional shield 46 and shield 41 considerably reducing heat transfer between the two shields.

While specific embodiments of the invention have been described above, it will be appreciated that the invention may be practiced otherwise then as described. The description is not intended to limit the invention.

What is claimed is:

1. A contamination barrier configured to permit radiation from a radiation source to pass through and to capture debris from the radiation source, the contamination barrier comprising:
    a support structure comprising an inner ring;
    a plurality of plate members arranged on the support structure and extending in a radial direction from an axis of the support structure; and
    a shield configured to shield the inner ring of the support structure from being hit by radiation or debris from the radiation source.

2. A contamination baffler according to claim 1, wherein the shield is a first shield and further comprising a second shield configured to block thermal radiation from the first shield.

3. A contamination baffler according to claim 1, wherein the shield is a first shield and further comprising a second shield configured to reduce heating of the first shield caused by direct radiation from the radiation source, wherein the second shield is disposed upstream of the first shield with respect to the direction of propagation of the radiation emitted by the radiation source.

4. A contamination baffler according to claim 3, wherein the second shield is substantially thermally isolated with respect to the first shield.

5. A contamination baffler according to claim 4, wherein the second shield is connected to the first shield.

6. A contamination baffler according to claim 1, further comprising a cooling spoke to support the shield, the cooling spoke being thermally connected to a structure displaced from the support structure.

7. A contamination barrier according to claim 6, wherein the shield comprises a plurality of shield members, each shield member being connected to the structure displaced from the support structure via a separate cooling spoke.

8. A contamination barrier according to claim 1, further comprising a first cooling device arranged to cool the shield.

9. A contamination barrier according to claim 8, further comprising a second cooling device arranged to cool the support structure.

10. A contamination barrier according to claim 1, wherein each of the plate members is disposed along a respective plane that includes an axis along which the radiation propagates in use.

11. A contamination barrier according to claim 1, wherein at least one end of each of the plurality of plate members is movable relative to the support structure.

12. A contamination barrier according to claim 1, wherein the support structure further comprises an outer ring, and at least one outer end of each of the plurality of plate members is connected to the outer ring.

13. A lithographic projection apparatus comprising:
    a radiation system configured to form a beam of radiation, the radiation system comprising:
    a contamination barrier configured to permit radiation from a radiation source to pass through and to capture debris from the radiation source, the contamination barrier comprising a support structure comprising an inner ring, a plurality of plate members arranged on the support structure and extending in a radial direction from an axis of the support structure, and a shield configured to shield the inner ring of the support structure from being hit by radiation or debris from the radiation source;
    a support structure to support a patterning structure to be irradiated by a beam of radiation to pattern the beam of radiation;
    a substrate support to support a substrate; and
    a projection system to image an irradiated portion of the patterning structure onto a target portion of the substrate.

14. A lithographic apparatus according to claim 13, wherein the radiation system further comprises a collector configured to collect radiation passing the contamination barrier.

15. A lithographic apparatus according to claim 13, further comprising a cooling spoke to support the shield, the cooling spoke being thermally connected to a structure displaced from the support structure.

16. A lithographic apparatus according to claim 15, further comprising a first cooling device arranged to cool the shield.

17. A method of manufacturing an integrated structure by a lithographic process, the method comprising:
    generating radiation with a radiation source;
    capturing debris from the radiation source using a contamination barrier comprising a support structure comprising an inner ring, a plurality of plate members arranged on the support structure and extending in a radial direction from an axis of the support structure, and a shield configured to shield the inner ring of the support structure from being hit by radiation or debris from the radiation source;
    patterning the radiation with a patterning structure; and
    imaging the patterned radiation onto a target portion of a substrate.

18. A method according to claim 17, wherein the contamination barrier comprises a further shield configured to reduce heating of the shield caused by direct radiation from the radiation source, wherein the further shield is disposed upstream of the shield with respect to the direction of propagation of the radiation emitted by the radiation source.

19. A method according to claim 18, wherein the further shield is substantially thermally isolated with respect to the shield.

20. A method according to claim 17, wherein the contamination barrier comprising a cooling spoke to support the shield, the cooling spoke being thermally connected to a structure displaced from the support structure.

21. A method according to claim 17, further comprising cooling the shield.

* * * * *